(12) United States Patent
Tomino et al.

(10) Patent No.: US 6,475,022 B2
(45) Date of Patent: Nov. 5, 2002

(54) HOUSING STRUCTURE OF A COMMUNICATION APPARATUS

(75) Inventors: Hiroyuki Tomino, Tokyo (JP); Akihiro Narita, Tokyo (JP)

(73) Assignee: Allied Telesis Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,821

(22) Filed: Mar. 22, 2001

(65) Prior Publication Data

US 2002/0064992 A1 May 30, 2002

(30) Foreign Application Priority Data

Nov. 27, 2000 (JP) .......................................... 2000-358653

(51) Int. Cl.$^7$ .............................................. H01R 13/58
(52) U.S. Cl. ...................................... 439/449; 439/929
(58) Field of Search ................................. 439/533, 527, 439/942, 449, 929, 86, 218; 379/433, 437, 438, 440, 399, 451, 324; 320/2, 108, 115

(56) References Cited

U.S. PATENT DOCUMENTS

| | | | | |
|---|---|---|---|---|
| 4,146,291 A | * | 3/1979 | Goff et al. .................. | 439/128 |
| 4,903,230 A | * | 2/1990 | Kaplan et al. ............... | 364/900 |
| 5,075,615 A | * | 12/1991 | Dantis ........................... | 320/2 |
| 5,256,955 A | * | 10/1993 | Tomura et al. ................ | 320/2 |
| 5,469,844 A | * | 11/1995 | Rogler ....................... | 128/630 |
| 5,648,712 A | * | 7/1997 | Hahn ........................... | 320/2 |
| 5,671,273 A | * | 9/1997 | Lanquist ..................... | 379/399 |
| 5,834,920 A | * | 11/1998 | Daniel ........................... | 320/2 |
| 5,844,985 A | * | 12/1998 | Kulberg et al. ............. | 379/433 |
| 5,918,189 A | * | 6/1999 | Kivela ........................ | 455/575 |
| 5,952,814 A | * | 9/1999 | Van Lerberghe ............ | 320/108 |

* cited by examiner

Primary Examiner—Neil Abrams
Assistant Examiner—J. F. Duverne
(74) Attorney, Agent, or Firm—McGinn & Gibb, PLLC

(57) ABSTRACT

A new structure of a communication apparatus allowing cables to be arranged, extra space to be eliminated, and allowing easy operation, is disclosed. A body housing has a flat and cylindrical shape and is provided with connectors at the bottom thereof. The body housing stably stands upright on a stand with the bottom portion thereof being accommodated in the stand. Cables connected to the connectors run through a cable restraint provided in the back side of the stand. The center portion of a front surface of the body housing 100 is slightly recessed allowing easy operation. Also, plural heat-dissipating openings are arranged longitudinally along the both side walls of the body housing.

15 Claims, 8 Drawing Sheets

(A)

(B)

(A)

(B)

HOUSING STRUCTURE OF A COMMUNICATION APPARATUS

BACKGROUND OF THE INVENTION

1. Field of the Invention

The present invention relates to a communication apparatus such as an access point in a wireless local area network (hereinafter, called wireless LAN), and in particular to a housing structure thereof.

2. Description of the Related Art

A wireless LAN is getting to be spread as an alternative to a wired LAN because it has advantages that cabling is not needed and layout flexibility is increased. In addition, not only as the alternative means, but it is regarded to be hopeful as a new network that positively uses the mobility of terminals.

The wireless LAN is generally composed of access points and plural fixed or mobile stations, and it allows for easy wireless communication between stations at different places by wired connection of access points wirelessly to each other (which may be realized by wired-connection).

These access points are often fixed at the high position of indoor on account of the property of wireless mediums (such as radio waves). But as well, they are frequently placed on desks and shelves in the case of having difficulty in installation at such a high position, in the case of access points connected wirelessly each other, or in the case of constructing a simple wireless LAN. Thus, when it is placed on desks, it turns out to be an important problem how to house power supply cords, LAN cables, computer connecting cables and so on in a limited space.

As shown in FIGS. 8A and 8B, communication apparatuses such as wireless LAN access points and terminal adapters, which are now commercially available, adopt such a structure that connectors and other switches are provided at the back surface side thereof. For example, there are some as shown in FIG. 8A, that a body 1 shaped in a rectangular parallelepiped is laid, a display portion 2 is provided at the front surface and cables 3 are connected to the back surface. On the other hand, there are some as shown in FIG. 8B that the body 1 is erected by means of a stand 4 and cables 3 are connected to the back surface.

However, in these prior arts, since cables and cords are extended directly from connectors of the back surface, it is difficult to systematically arrange cables, resulting in increased extra space when they are put on desks.

Further, in the case of moving the communication apparatus, cables get entangled in a high probability and can be inconveniently dealt with, and that they look disordered. Also, there is another problem to easily catch soil such as dust on account of connectors are exposed at the back surface of body.

In the conventional communication apparatuses, since housing is basically shaped in a rectangular parallelepiped, it has still another problem to be inconvenient to be carried.

SUMMARY OF THE INVENTION

An object of the present invention is to provide a new structure of communication apparatus that allows for arranging housing cables and getting rid of extra space to install.

Another object of the present invention is to provide a new shape of communication apparatus that can be easily used.

According to an aspect of the present invention, a communication apparatus communication apparatus including at least one connector, includes: a body housing having a flat and cylindrical shape and the at least one connector provided in a bottom portion thereof; and a stand for holding the body housing upright with accommodating the bottom portion of the body housing.

The stand preferably includes: a base plate member; a cylindrical member fixed on the base plate member, for accommodating the bottom portion of the body housing; and a slit provided in a back side of the cylindrical member, wherein cables run through the slit. The slit further preferably has a cable restraint formed at an end thereof, wherein the cable restraint groups the cables.

Preferably, a center portion of a front surface of the body housing is recessed.

Both side walls of the body housing are preferably curved. The body housing further preferably has a plurality of heat-dissipating openings arranged longitudinally in the both side walls of the body housing. More preferably, a row of the heat-dissipating openings is extended from an upper end to a lower end of each side wall of the body housing.

According to another aspect of the present invention, a communication apparatus includes: a housing having a flat and tower-like shape in which a center portion of a front surface of the housing is slightly recessed; and at least one connector provided in a bottom portion of the housing, wherein the communication apparatus is used in such a way that the housing stands with placing the at least one connector face down.

As described above, according to the present invention, since the space for the base plate of the stand is only needed to keep the body housing standing on the stand, a communication apparatus can be put on a desk or the like with sufficient space. Also, since cables are extended to outside through the cable restraint, plural cables can. be grouped and arranged systematically, which avoids causing cables to be disordered and occupy extra space.

Since the body is shaped like a flat and cylindrical tower and the center portion thereof is slightly recessed, it is settled in a palm and can be easily carried and used.

Since connectors are provided downward in the bottom portion of the body housing with accommodated in the stand, they resist physical shocks and catching dust.

DESCRIPTION OF THE PREFERRED EMBODIMENT

Hereinafter, a wireless LAN device, which is used as an Access Point (AP) defined by IEEE 802.11b standards, is called as "wireless LAN access point" or simply "access point".

Figure 1:
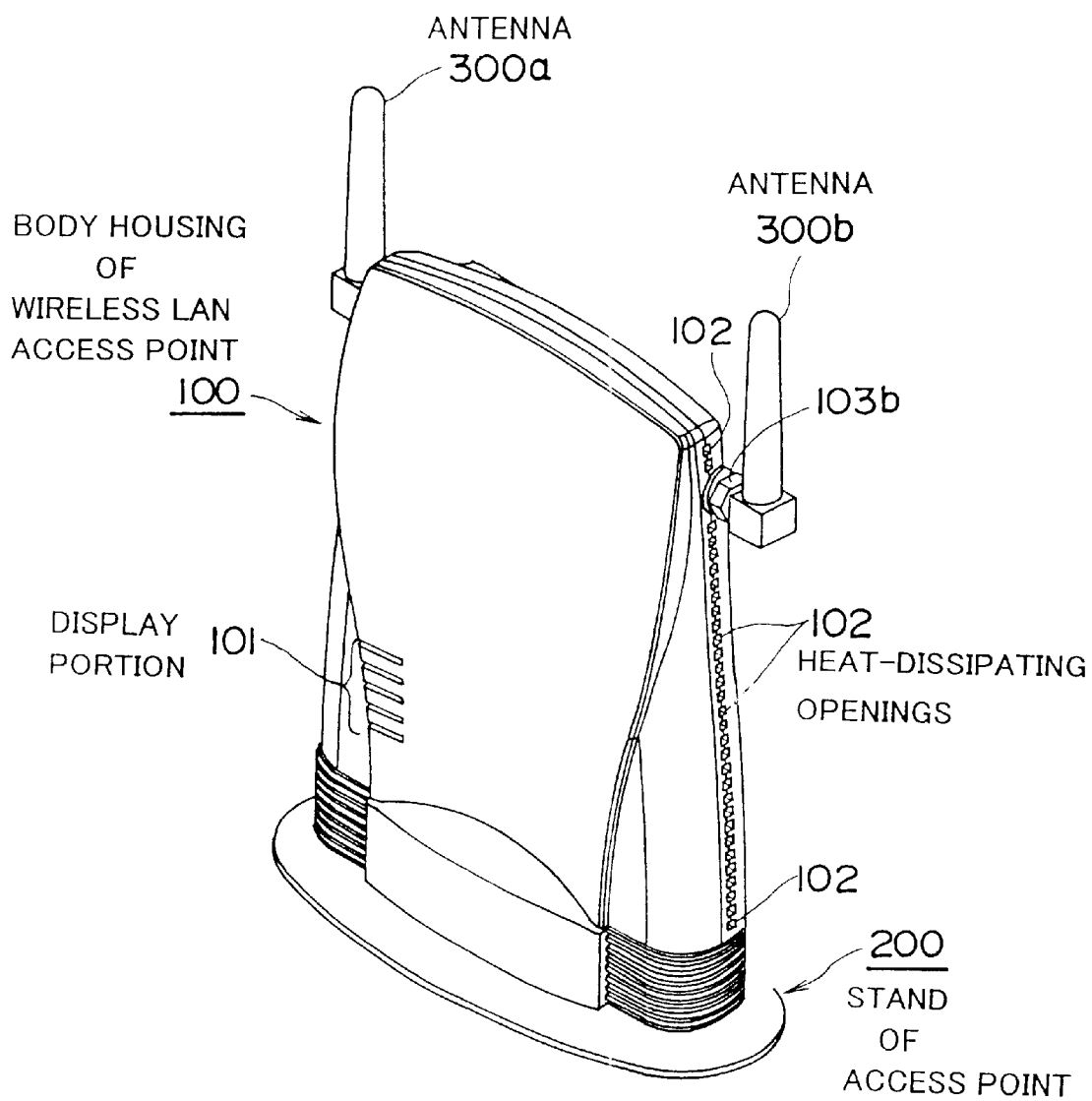
FIG. 1 is a perspective view of a wireless LAN access point according to an embodiment of the present invention.
Figure 2:
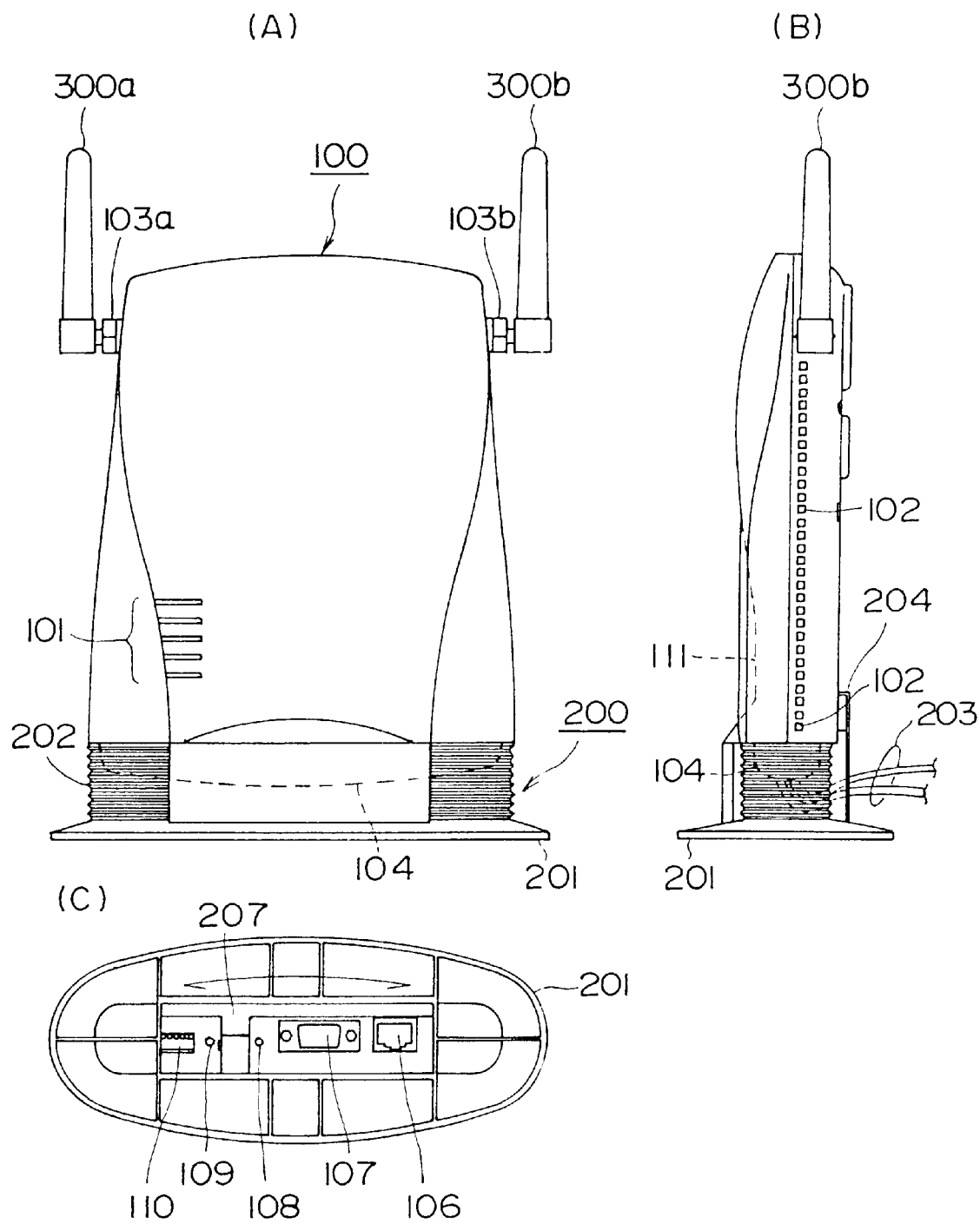
FIG. 2A is a front view of the wireless LAN access point according to the embodiment.
FIG. 2B is a side view of the wireless LAN access according to the embodiment.
FIG. 2C is a bottom view of the wireless LAN access according to the embodiment.
Figure 3:
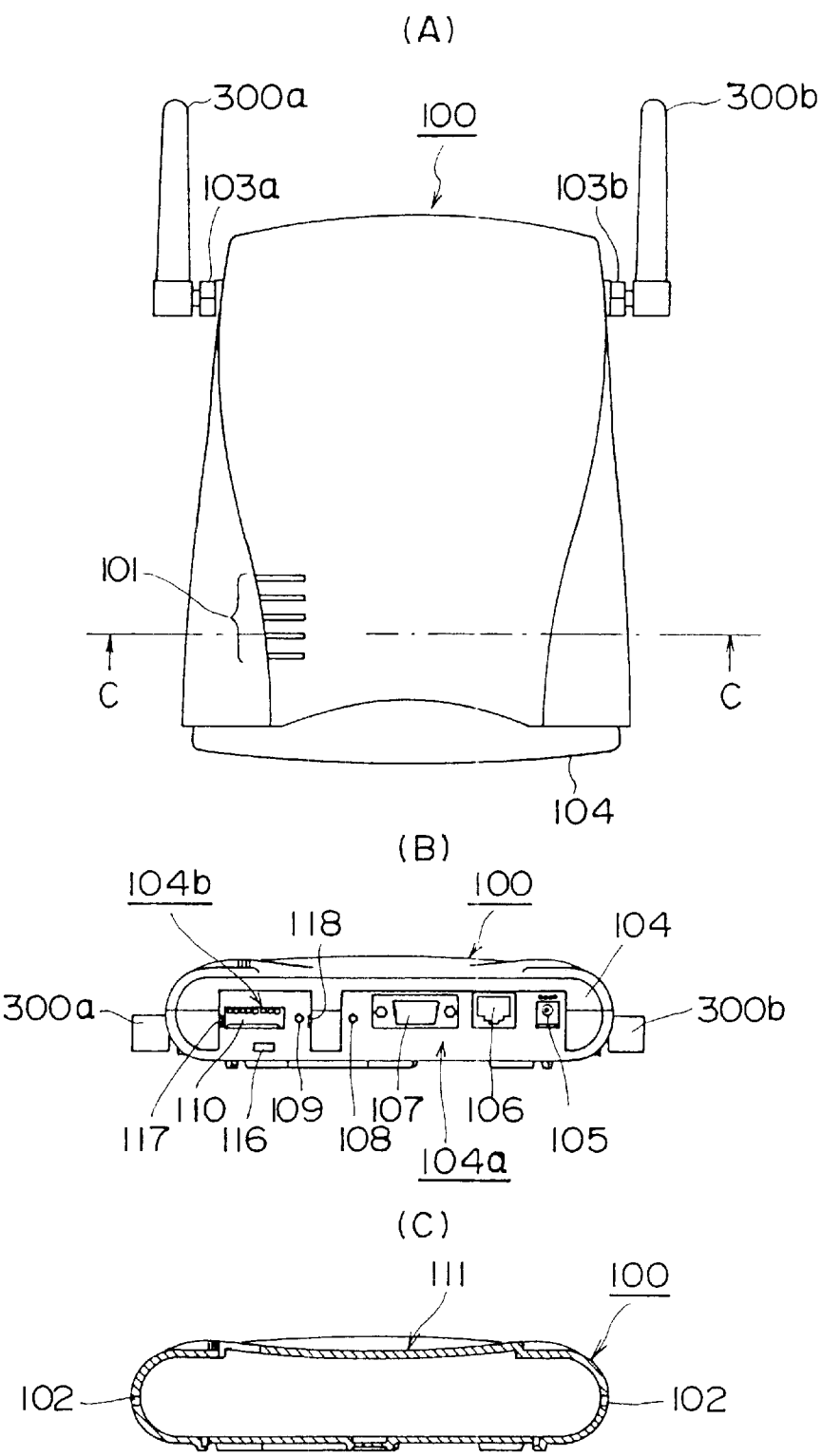
FIG. 3A is a front view of the body of the wireless LAN access point according to the embodiment.
FIG. 3B is a bottom view of the body of the wireless LAN access point according to the embodiment.
FIG. 3C is a cross-sectional view taken in line C—C of FIG. 3A.
Figure 4:
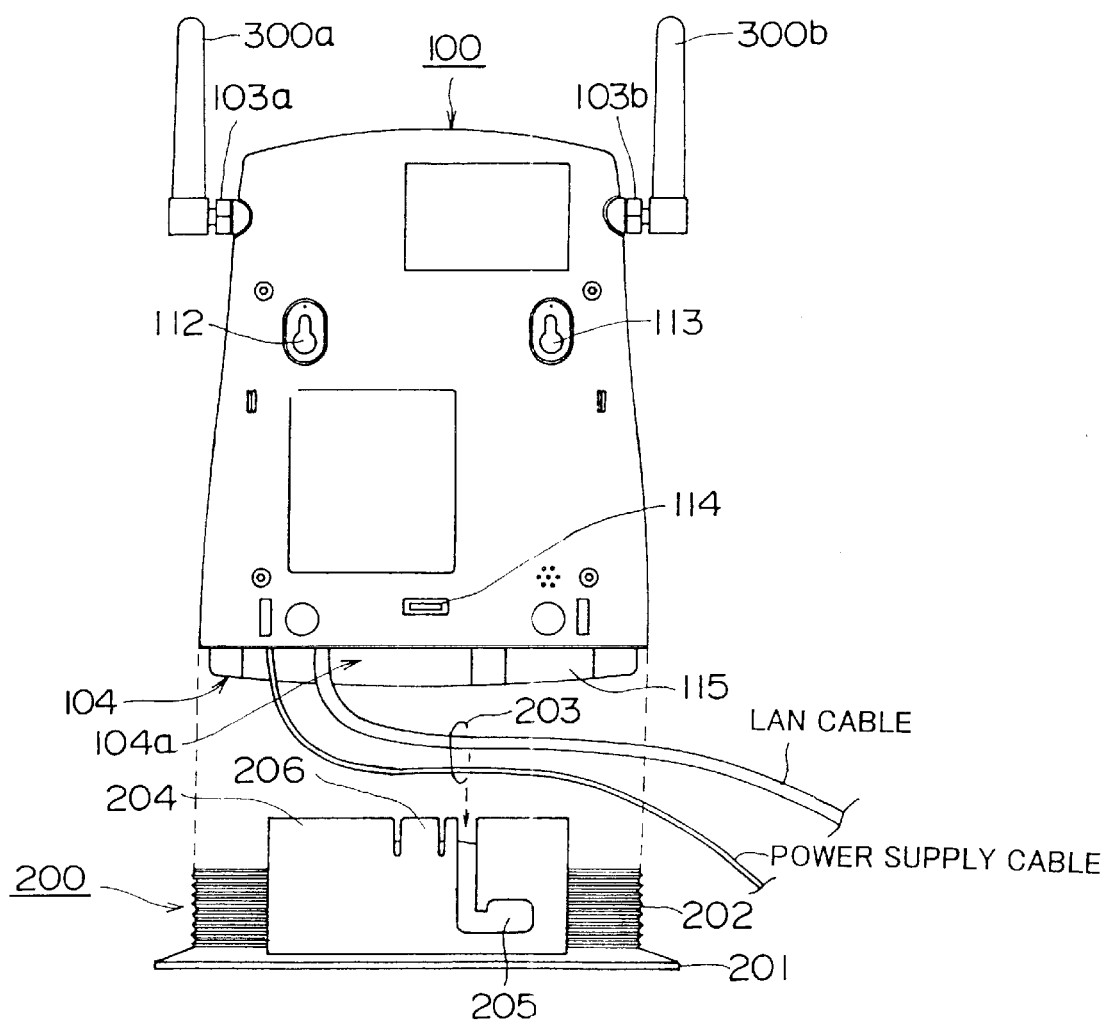
FIG. 4A is a rear elevation view of the body and the stand of the wireless LAN access point according to the embodiment.
FIG. 4B is a bottom view of the body of the wireless LAN access point having a DIP switch cover installed.
Figure 4:
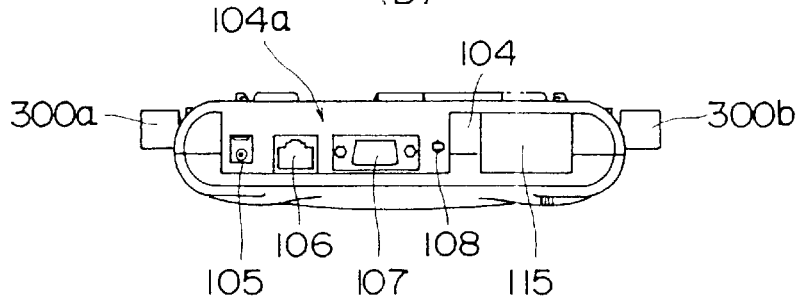

As shown in FIG. 1, a wireless LAN access point is composed of a body housing 100 and a stand 200 allowing the body housing 100 to be detachably placed thereon. The body housing 100 is shaped like a flat and cylindrical tower, and is provided with a display portion 101 composed of light-emitting diodes (LEDs) and the like at the predetermined position of front surface thereof and is further provided with plural heat-dissipating openings 102 that are vertically arranged at regular intervals all over from the upper end to the lower end of side surfaces thereof. A pair of diversity antennas 300a and 300b are provided to be projected like horns from the upper surface of the body housing at both sides. Hereinafter, referring to FIGS. 2 to 4, the structure of the present embodiment will be described in detail.

Referring to FIGS. 2A–2C, the respective antennas 300a and 300b are detachably coupled to antenna connectors 103a and 103b, and thereby can be easily replaced with different type of antennas.

The stand 200 is molded in a single unit composed of a base plate 201, a cylindrical portion 202, and a back plate 204. The base plate 201 has a wide area, which enables the access point body to stably stand on the cylindrical portion 202 of the stand 200. The hollow cross section of the cylindrical portion 202 is formed so as to accommodate a bottom portion 104 of the body housing 100. Since an opening 207 through the base plate 201 is formed at the center thereof, connectors and the like provided in the bottom portion 104 of body housing 100 are visible. Therefore, it can be easily checked whether cables are properly connected to the connectors and the like.

As shown in FIG. 3B, two recess portions 104a and 104b are formed in the bottom portion 104 of body housing 100. One recess portion 104a is provided with a DC power supply connector 105 (here, DC5V2.5A), a 10/100BASE-TX LAN port 106, a terminal connector 107 and a reset switch. The other recess portion 104b is provided with a set switch 109 and a DIP switch 110.

As described later, since a DIP switch cover (not shown) is shaped to detachably fit into the recess portion 104b so as to fill the concave portion thereof, the set switch 109 and the DIP switch 110 are covered with the DIP switch cover and thereby misoperations can be prevented. To install the DIP switch cover easily, the guiding grooves are formed at both sides of the DIP switch cover, and a hook is provided at a predetermined position. On both side walls of the recess portion 104b, guiding convex portions 117 and 118 are provided to engage with respective ones of the guiding grooves of the DIP switch cover. The bottom surface of the recess portion 104b has a hook hanging hole 116 formed at the predetermined position thereof.

As shown in FIG. 3C, the body housing 100 is flat and cylindrical, and the both sides having the heat-dissipating openings 102 formed are curved, and a center portion 111 in the lower part of front surface is concaved slightly. In the present embodiment, the body housing 100 has a thickness of 4 centimeters approximately, and it can be easily carried with one hand because the curving portion of side and the concavely curved portion 111 can be settled in one's palm.

Referring to FIG. 4A, on the back side of body housing 100, wall installation holes 112 and 113 are provided in order to fix the access point on a wall, pillar, or the like. In other words, the access point can be easily installed at the high position of indoor by handing the wall installation holes 112 and 113 over a pair of hooks or screws fixed on the wall and the like. Then, a hole 114 is provided to fix the body housing 100 to the stand 200 at the center of lower part of the body housing 100.

A back plate 204 is fixed in the back side of the stand 200, and has an L-shaped slit formed therein. The L-shaped slit has a cable restraint 205 shaped like a key at the end of slit. Also, a fixing hook 206 is provided at the center of back plate 204.

For example, as shown in FIG. 4A, in the case where cables 203 are connected with the power supply connector 105 and the LAN port 106 of the body bottom portion 104 and the body housing 100 is placed on the stand 200, the cables 203 can be put together in the cable restraint 205 through the slit of back plate 204.

The bottom portion 104 of the body housing 100 is inserted into the cylindrical portion 202 of the stand 200, and the hook 206 located at the center of the back plate 204 is engaged with the hole 114 of the body housing 100. Thereby, the body housing 100 is stopped vertically, and it can be fixed to the stand 200.

As shown in FIG. 4B, since the DIP switch cover 115 is normally inserted into the recess portion 104b (FIG. 3B) of base plate 104, the setting of the DIP switch 110 (FIG. 3B) is prevented from carelessly changing.

Since the connectors 105, 106 and 107 are arranged downward in the cylindrical portion 202 of the stand 200, they are protected from external shocks and don't catch dust easily, ensuring more stable and reliable operation.

Figure 5:
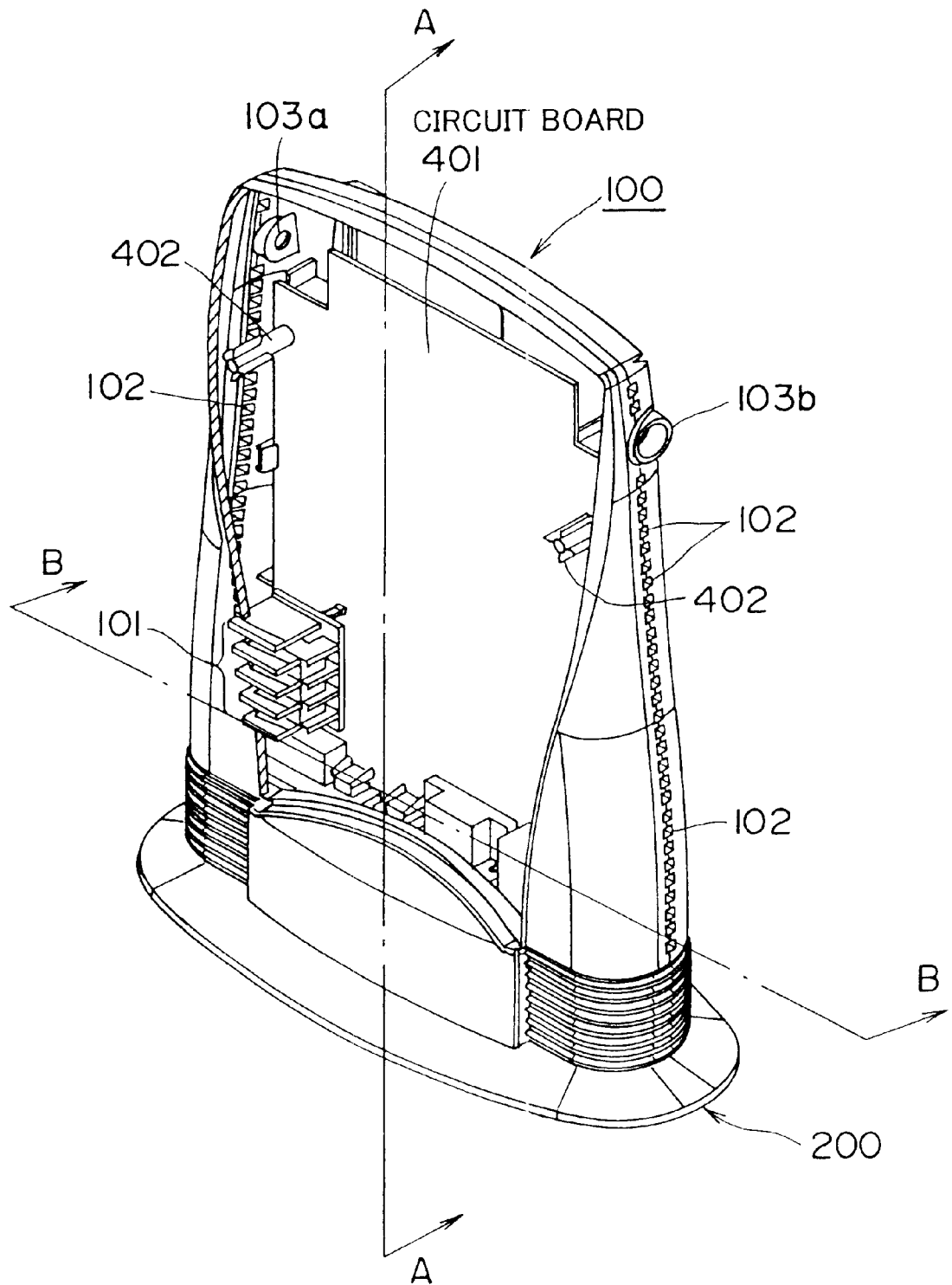
FIG. 5 is a perspective view of the wireless LAN access point showing that the front cover of the body housing is partially cutaway.
Figure 6:
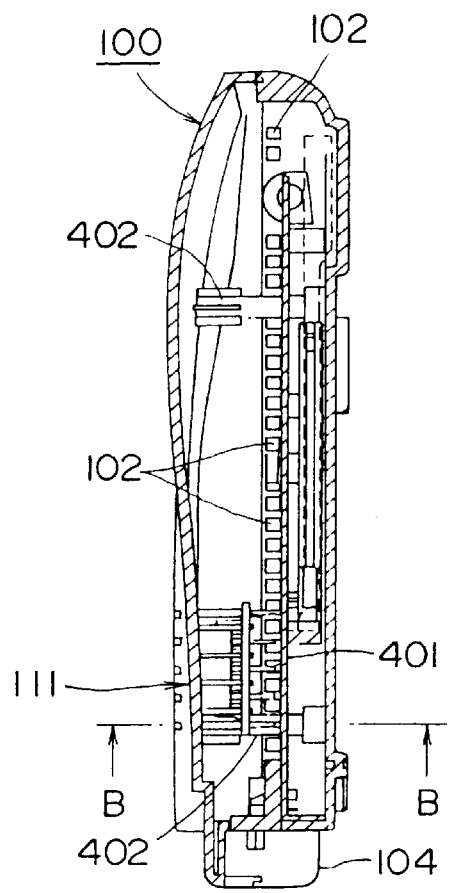
FIG. 6A is a cross-sectional view taken in line A—A of FIG. 5.
FIG. 6B is a cross-sectional view taken in line B—B of FIG. 5.
Figure 6:
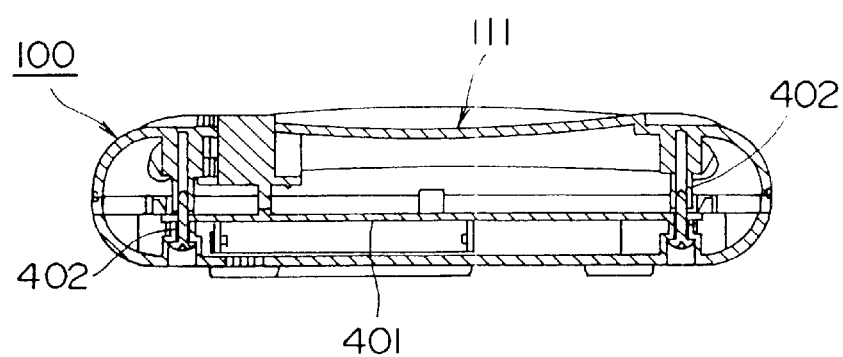

As shown in FIG. 5, a circuit board 401 having various electronic components mounted and wiring installed thereon is vertically fixed in the body housing 100. Specifically, as shown in FIG. 6, the circuit board 401, which is placed at a predetermined distance from the inner wall of the body housing 100 and is parallel to the row of heat-dissipating openings 102, is fixed to the body housing 100 by four supports 402. In this case, as shown in FIG. 6A, the circuit board 401 is fixed such that the row of heat-dissipating openings 102 is positioned in the side of the circuit board 401 mounted with the electronic components.

Since the rows of heat-dissipating openings 102 arranged in such a way are formed over both sides, heat produced by electronic components (especially, a power supply and a high-frequency device) on the circuit board 401 can be efficiently released. In the present embodiment, each of the heat-dissipating openings 102 is a 3.5 millimeter square.

As a material of body housing 100, an electrical conductive plastic can be adopted. As well known, the wireless LAN access point includes radio-frequency circuits and therefore it is necessary to suppress radio influence on the surroundings. In particular, the influence on medical appliances in hospitals and the like must be avoided. In general, a shielding structure is realized by forming a shielding layer on the inner wall of the housing using an established method such as aluminum vapor deposition.

However, as the structure of housing becomes complex, it is getting difficult to form the shielding layer as a separate process. When the body housing is molded using a resin including an electrically conductive filler, that is, an electrically conductive plastic, the above-described body can be made up and the electromagnetic shield can be also achieved at the same time. However, it is necessary to provide the antennas outside the body housing as described in the present embodiment. If the antennas are provided inside the housing, the housing should be made of resin having neither electromagnetic shielding properties nor electromagnetic shield layer. The electromagnetic shielding layer may be provided just in parts having no effect on transmission and reception of radio waves.

Figure 7:
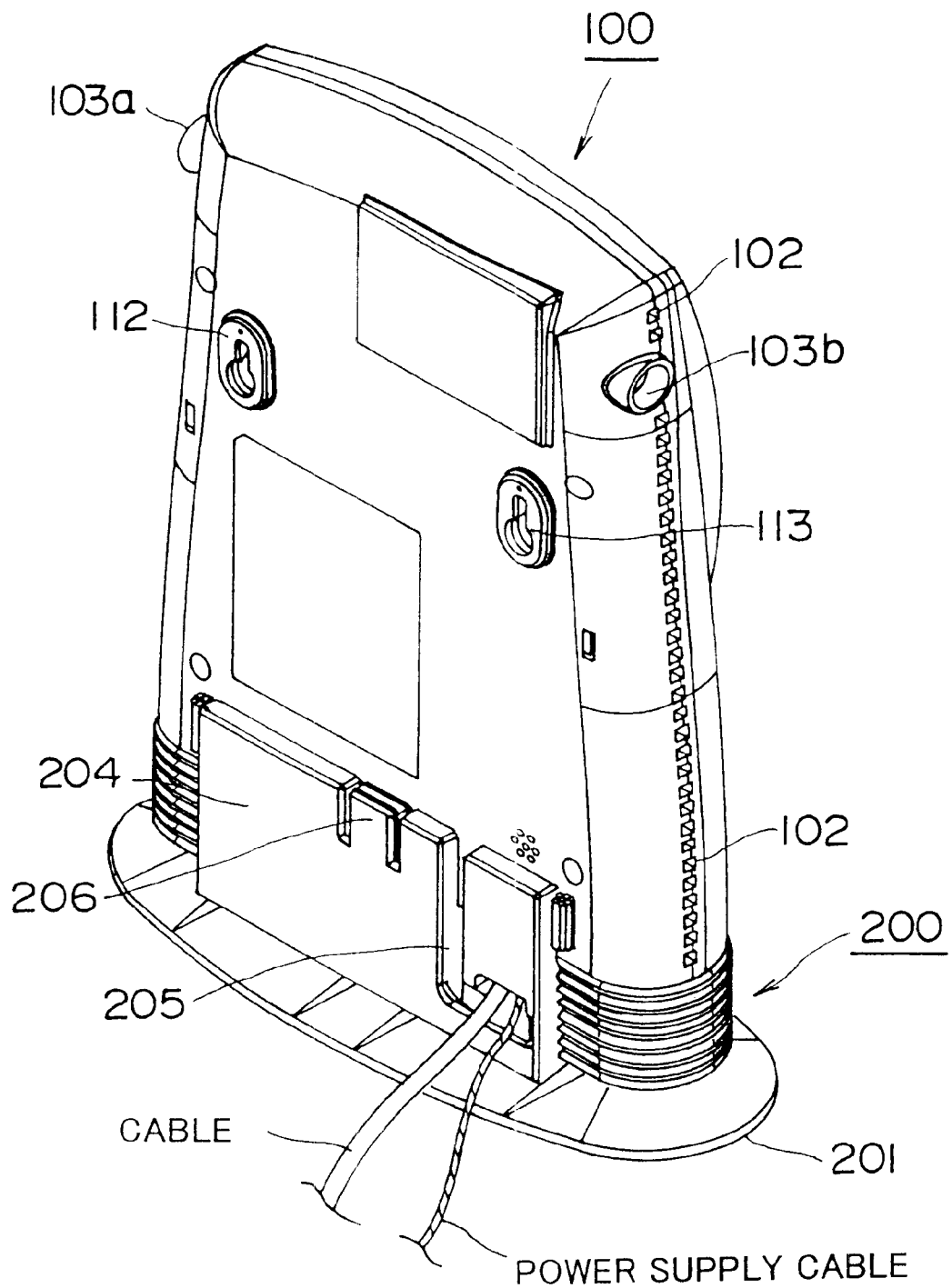
FIG. 7 is a perspective view showing the back side of the wireless LAN access point.
Figure 8:
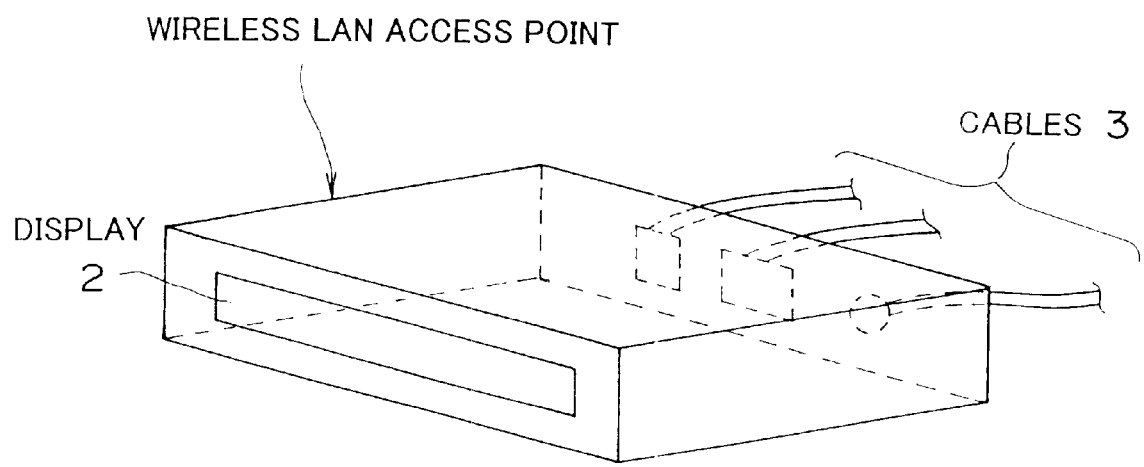
FIG. 8A is a perspective view of an example of a conventional communication apparatus.
FIG. 8B is a perspective view of another example of a conventional communication apparatus.
Figure 8:
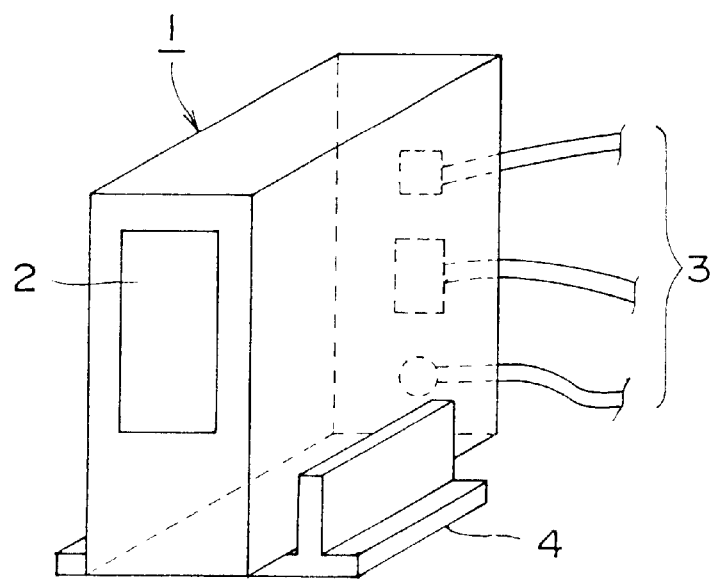

As shown in FIG. 7, the body housing 100 having cables connected thereto is fixed to stand on the stand 200. Since cables run through the cable restraint 205, plural cables can be grouped and arranged systematically.

As described above in detail, according to the present invention, since the space for the base plate of the stand is only needed to keep the body housing standing on the stand, a communication apparatus can be put on a desk or the like with sufficient space. Also, since cables are extended to outside through the cable restraint, plural cables can be grouped and arranged systematically, which avoids causing cables to be disordered and occupy extra space.

Since the body is shaped like a flat and cylindrical tower and the center portion thereof is slightly recessed, it is settled in a palm and can be easily carried and used.

As described above, since connectors are provided downward in the bottom portion of the body housing with accommodated in the stand, they resist physical shocks and catching dust.

When the present invention is applied to a wireless LAN access point, the antennas are provided such that they are projected from the upper portion of body housing and therefore the antennas is placed at a position above the body housing on the stand. Therefore, a sufficient basic service area can be formed even if it is put on the desk in daily use.

What is claimed is:

1. A communication apparatus comprising:
a body housing having a substantially flat and cylindrical tower shape and at least one connector oriented downward in a bottom portion thereof to receive at least one communications cable when used in a wired mode; and
a stand connected to the body housing and holding the body housing upright while accommodating the bottom portion of the body housing,
wherein said body housing connected to said stand resists physical shock and dust collection while requiring minimal space usage due to said at least one connector and systematic arrangement of said at least one communications cable.

2. The communication apparatus according to claim 1, wherein the stand comprises:

a base plate member;
a cylindrical member fixed on the base plate member, for accommodating the bottom portion of the body housing; and
a slit provided in a back side of the cylindrical member where at least one communications cable runs through the slit.

3. The communication apparatus according to claim 2, wherein the slit has a cable restraint formed at an end thereof, so that the cable restraint groups said at least one communications cable.

4. The communication apparatus according to claim 1, wherein a center portion of a front surface of the body housing is recessed.

5. The communication apparatus according to claim 2, wherein a center portion of a front wall of the body housing is recessed.

6. The communication apparatus according to claim 4, wherein both side walls of the body housing are curved.

7. The communication apparatus according to claim 5, wherein both side walls of the body housing are curved.

8. The communication apparatus according to claim 1, wherein the body housing has a plurality of heat-dissipating openings arranged longitudinally in both side walls of the body housing.

9. The communication apparatus according to claim 8, wherein a row of the heat-dissipating openings is extended from an upper end to a lower end of each side wall of the body housing.

10. The communication apparatus according to claim 1, wherein the body housing further has a DIP switch provided the bottom portion thereof, the DIP switch setting the communication apparatus, wherein the bottom portion has a fixing means for detachably fixing a cover member with which the DIP switch is covered.

11. The communication apparatus according to claim 1, wherein the body housing further comprises a pair of antenna connectors which is provided at both ends of an upper portion thereof.

12. The communication apparatus according to claim 1, wherein the body housing is made of an electrically conductive plastic.

13. A communication apparatus comprising:
a body housing having a substantially flat and cylindrical tower-like shape in which a center portion of a front surface of the housing is slightly recessed; and
at least one connector oriented downward in a bottom portion of the body housing to receive at least one communications cable; and
a plurality of heat-dissipating openings arranged longitudinally in both side walls of the body housing,
wherein the communication apparatus is used in such a way that the body housing stands with said at least one connector face down to receive at least one communications cable.

14. The communication apparatus according to claim 13, wherein both side walls of the housing are curved.

15. The communication apparatus according to claim 13, wherein a pair of antenna connectors are provided at both ends of an upper portion of the housing.

* * * * *